United States Patent [19]
Bohmer

[11] Patent Number: 4,690,509
[45] Date of Patent: Sep. 1, 1987

[54] WAVEFORMS ON A LIQUID CRYSTAL DISPLAY

[75] Inventor: William Bohmer, Flanders, N.J.

[73] Assignee: Control Interface Company Limited, Randolph, N.J.

[21] Appl. No.: 656,972

[22] Filed: Oct. 2, 1984

[51] Int. Cl.$^4$ .............................................. G02F 1/13
[52] U.S. Cl. ..................................... 350/333; 350/332
[58] Field of Search .............................. 350/332–336, 350/331 R; 324/121 R, 111; 364/518

[56] References Cited

U.S. PATENT DOCUMENTS

| | | | |
|---|---|---|---|
| 3,322,485 | 5/1967 | Williams | 350/331 R |
| 3,807,831 | 4/1974 | Soref | 350/336 |
| 3,820,875 | 6/1974 | Bohmer | 350/335 |
| 3,834,794 | 9/1974 | Soref | 350/336 |
| 4,510,444 | 4/1985 | Haussel et al. | 324/121 R |
| 4,548,474 | 10/1985 | Nagae et al. | 350/333 |

Primary Examiner—Arthur G. Evans
Attorney, Agent, or Firm—Caesar, Rivise, Bernstein, Cohen & Pokotilow, Ltd.

[57] ABSTRACT

Liquid crystal display for use in an oscilloscope. Analog multiplexing techniques enable displaying of waveforms of input signals with frequencies as high as 1 MHz. An xy grid is formed by two interleaved arrays of alternate parallel transparent electrodes. Use of liquid crystal material results in very low power consumption and voltage threshold, improved lifetime, a wide viewing angle, and no image washout at high ambient light levels. Addition of a digital voltmeter, frequency counter, auto sync circuitry, dual trace, and movable cursor expands the capabilities of the display. A gray scale surrounds the actual null points on the display, allowing suitable resolution with a minimum of channels.

57 Claims, 15 Drawing Figures

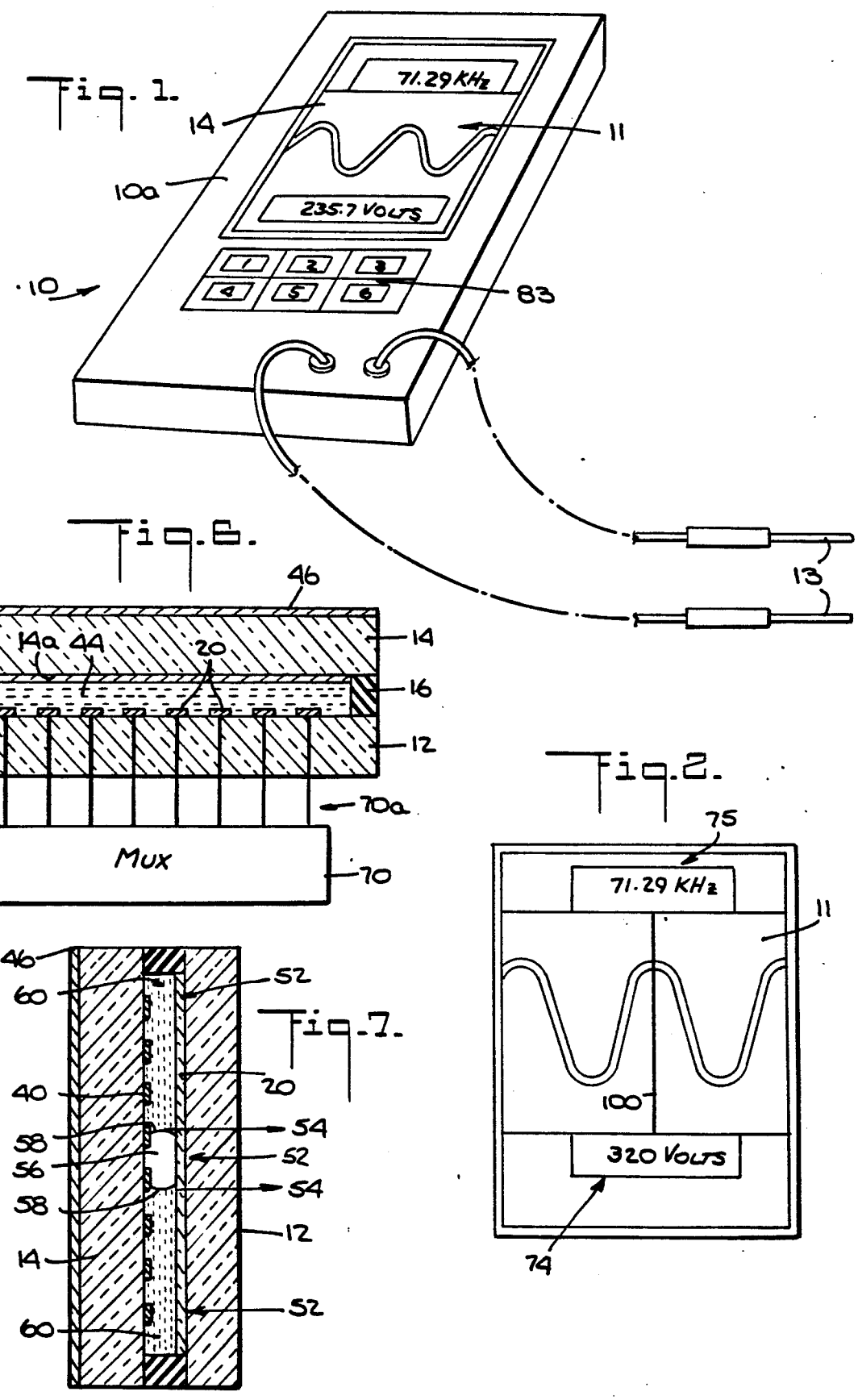

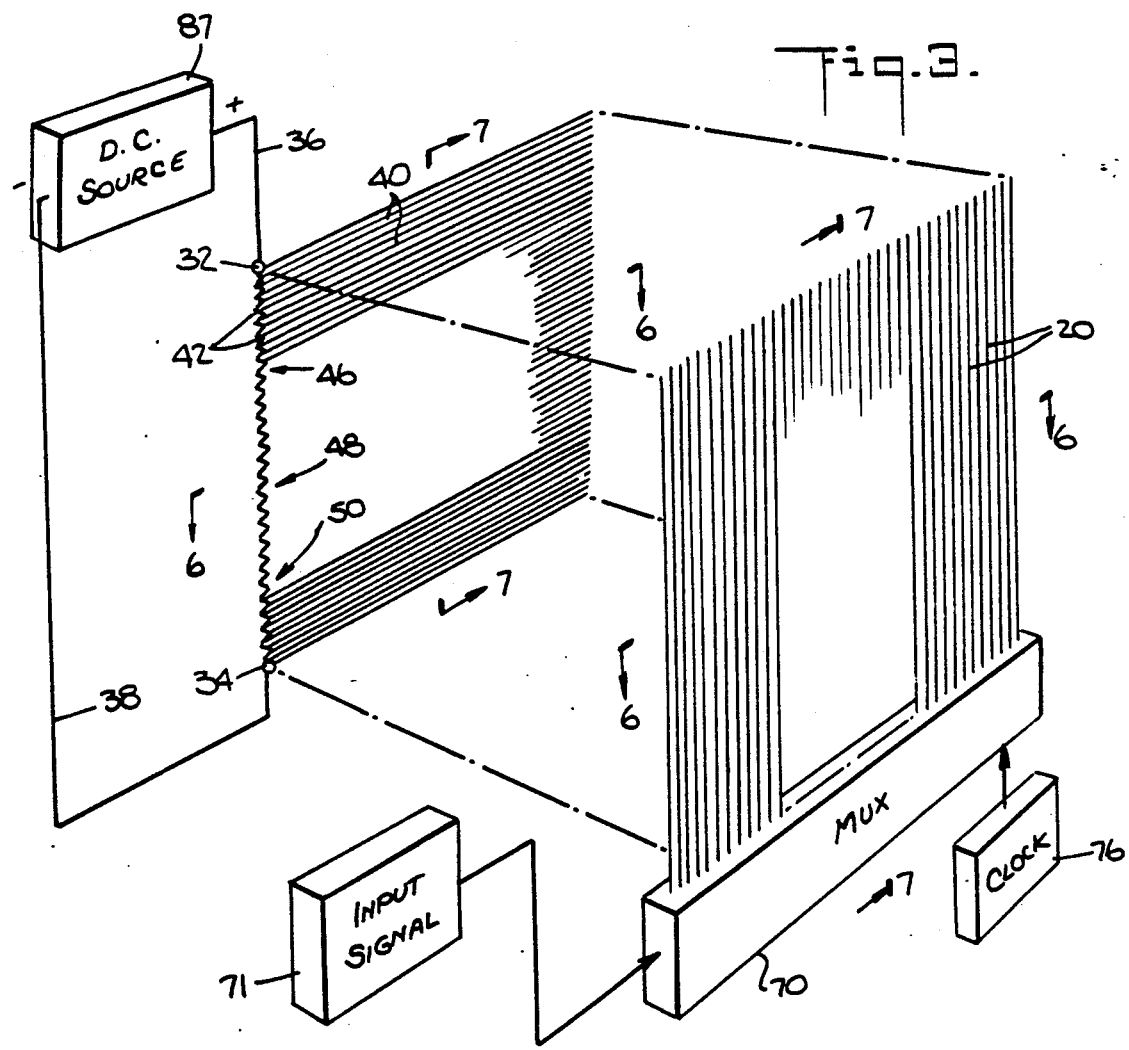
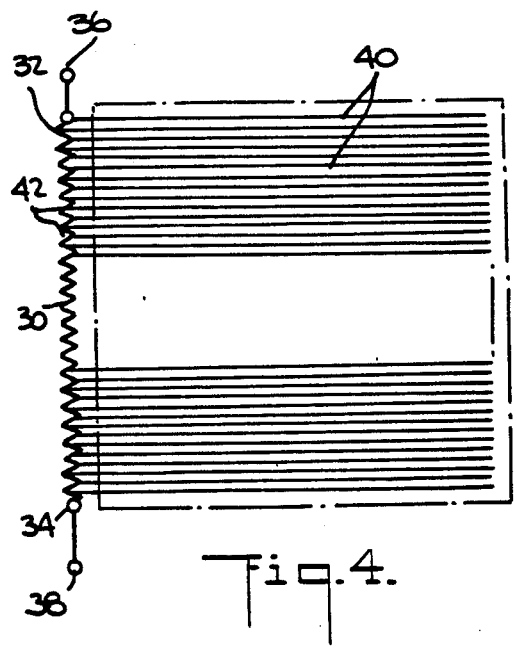
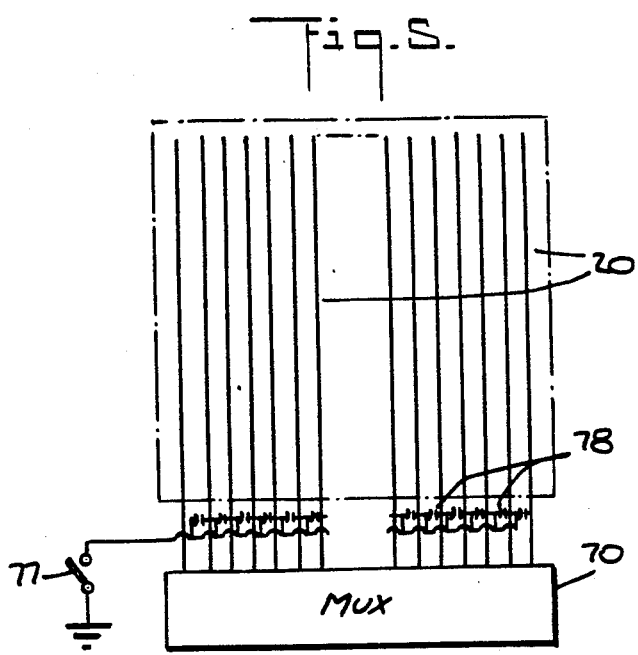

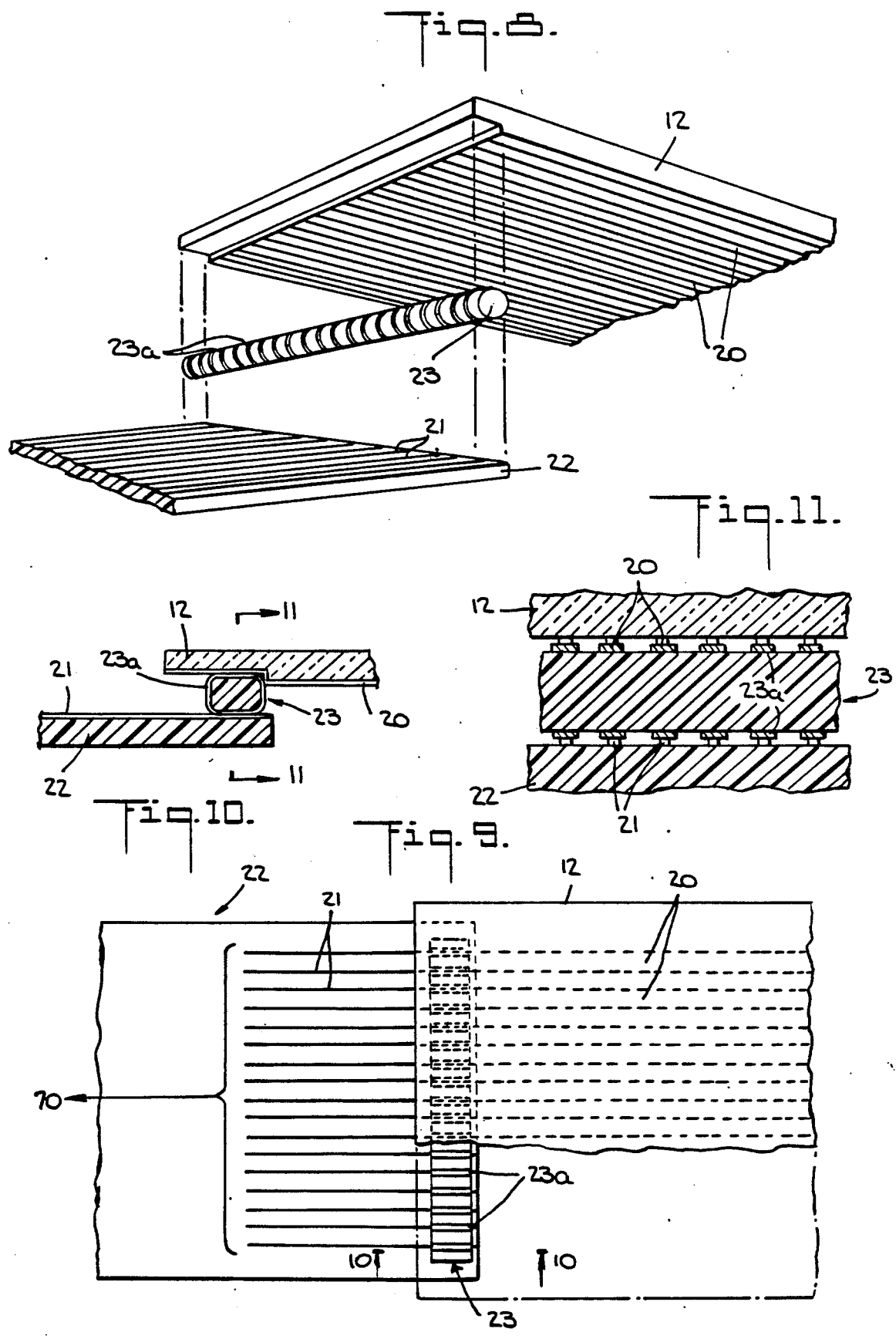

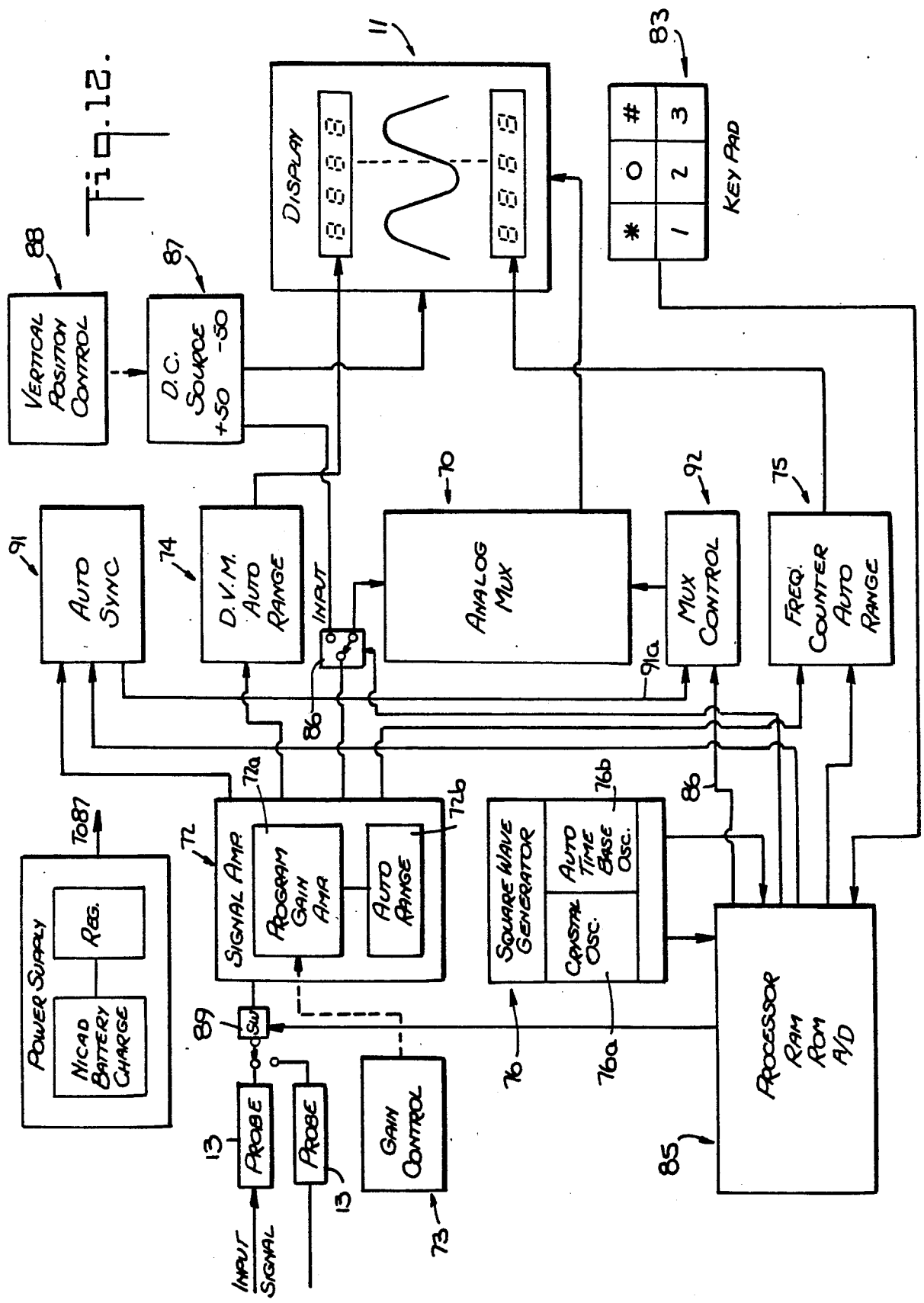

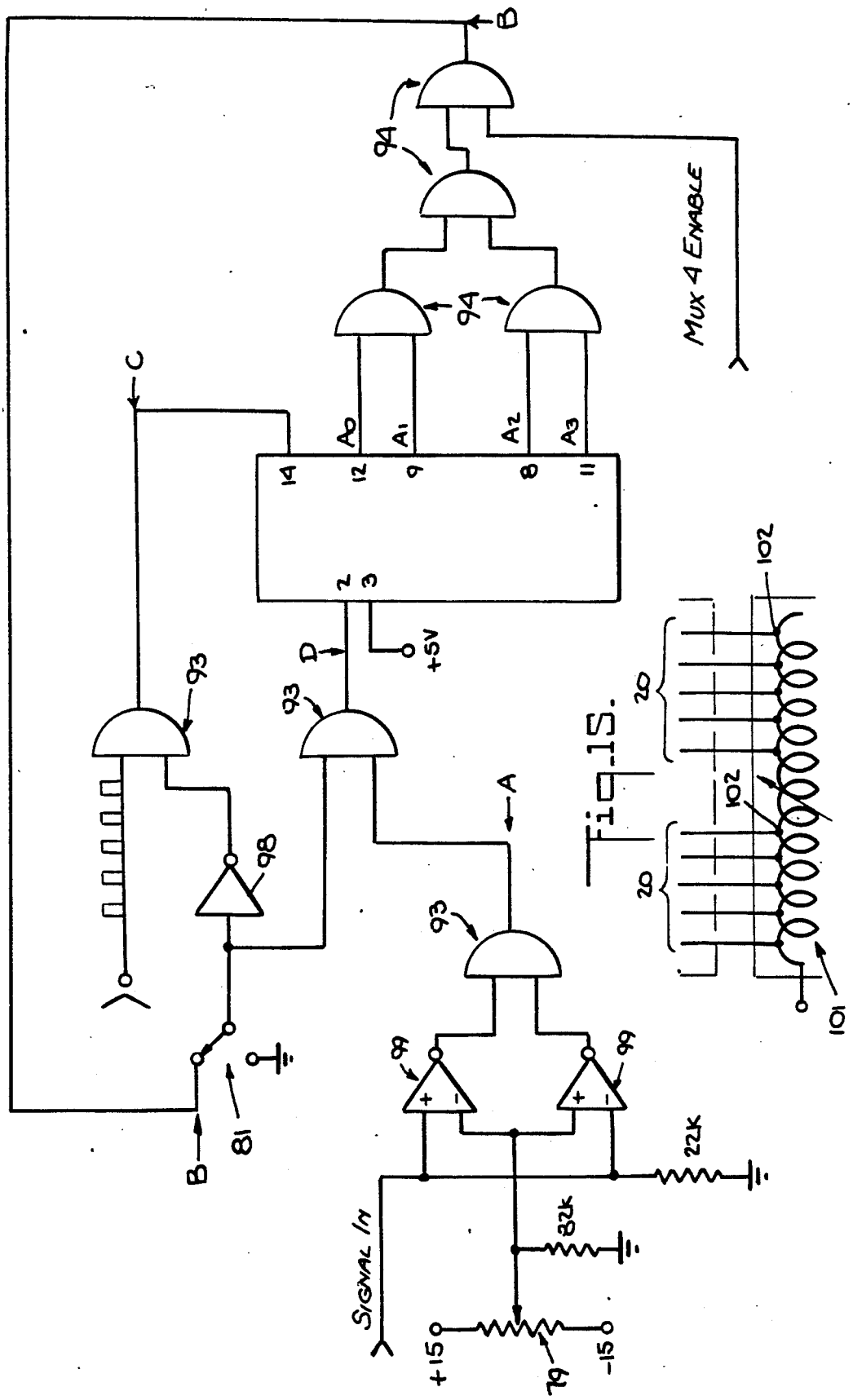

WAVEFORMS ON A LIQUID CRYSTAL DISPLAY

BACKGROUND OF THE INVENTION

1. Field of the Invention

The invention relates to devices for presenting visual displays of input signals such as the displays shown on cathode ray tubes (CRT's). More particularly, the present invention relates to display devices utilizing liquid crystals and electrode and scanning arrangements therefor.

The invention contemplates utilization of liquid crystal materials in which the propagation or characteristics of light incidence thereon can be altered by inducing an electric or magnetic field in the liquid crystal material. Such liquid crystal materials include, but are not limited to, nematic liquid crystal materials possessing dynamic or quiescent scattering, or twisted field-effect electro-optical properties, and the mixtures of these nematic liquid crystal materials with cholesteric liquid crystal materials.

In a dynamic scattering liquid crystal material, light is transmitted substantially unaffected through the material in the absence of an electric field across the liquid material. When an electric field of sufficient magnitude is induced in the liquid crystal material, light incident upon the material is optically scattered and transmission of light through the material is substantially prevented.

A quiescent scattering liquid crystal material possesses field effective electro-optical properties which are the converse of those of the dynamic scattering liquid crystal. Thus, in the absence of an electric field, the quiescent scattering liquid crystal material scatters incident light, while an electric field induced in the quiescent liquid crystal material causes it to transmit incident light therethrough.

In a twisted nematic liquid crystal material, layers of molecules at opposed surfaces of the material can be caused to be aligned at an angle with each other in the absence of a field. The molecules between the opposed surfaces have varying angular alignments with the result that the molecular orientation through the material from one surface to the other is helical of "twisted". The plane of polarization of plane polarized light is rotated by the angle formed by the opposed surface molecules as the light passes through the liquid crystal material in the absence of a field. The application of an electric field to the material destroys the twisted alignment of the molecules with the result that the material transmits incident plane polarized light therethrough without substantial rotation of the plane of polarization.

Cathode-ray tube oscilloscopes are used to produce a luminuous plot on a fluorescent screen which is the graphical representation of an electric signal being used as the input. Motion of a focused spot leaves a visible trace on the phosphor on the viewing screen of the tube. The primary advantage of cathode-ray oscilloscopes over other forms of plotting devices is its speed of response. Commercially available instruments can display frequencies as high as 2 GHz.

2. Prior Art

Liquid crystal materials of the types referred to above, as well as others, are well known in the prior art. See, for example, G. Heilmeier, "Liquid-Crystal Display Device", Scientific American, April, 1970, pp. 100–106; G. Heilmeier, L. Zanoni & L. Barton, "Dynamic Scattering: A New Electro-optic Effect in Certain Classes of Nematic Liquid Crystals", Proceedings of the IEEE, Vol. 56, No. 7, July 1968, pp. 1162–1171; and U.S. Pat. No. 3,918,796, issued on Nov. 11, 1975, to Fergason.

Nematic scattering liquid crystal electro-optical elements are well known in the prior art, as described, for example, in U.S. Pat. No. 3,322,485, issued on May 30, 1967, to Williams. Twisted liquid crystal electro-optical elements which require the use of polarizing elements, are also well known in the art, as described, for example, in the aforementioned Fergason '796 patent. The Fergason '796 patent and U.S. Pat. No. 3,834,792, issued on Sept. 10, 1976, to Janning, describe two arrangements for aligning liquid crystal molecules in a display in order that polarized light passing through the material in the absence of an electric field is rotated. The Fergason '796 patent teaches rubbing each of the glass plates which enclose the liquid crystal material in a single predetermined direction and thereafter positioning the plates with the directions of rubbing of the plates forming an angle through which the polarized light is to be rotated. The Janning '792 patent teaches the growth of an alignment film on each plate and then the arranging of the plates with the directions of growth on each of the plates forming a desired angle with respect to one another. Both the Fergason '796 and the Janning '792 patents disclose arrangements of polarizers and twisted liquid crystal cells.

U.S. Pat. No. 3,820,875, issued on June 28, 1974, to William Bohmer, the applicant herein, discloses devices utilizing field-effect scattering dielectrics, such as for example, nematic liquid crystal materials and mixtures of cholesteric and nematic liquid crystal materials. The '875 patent also discloses scanning devices incorporating such dielectrics. The disclosure of the '875 patent is incorporated herein by reference.

U.S. Pat. No. 3,807,831 issued on April 30, 1974 to Soref discloses a liquid crystal display device which includes interleaved arrays of alternate parallel electrodes. A field is induced between interleaved electrodes.

Optoceramic devices are disclosed in C. E. Land, P. D. Thatcher and G. H. Haertling, Electro-optic Ceramics, Academic Press, 1974 at pages 137–233.

Liquid crystals and liquid crystal displays are described in 14 R. Kirk & D. Othmer, Encyclopedia of Chemical Technology 395–427 (3rd ed 1981) and 7 R. Kirk & D. Othmer, supra, at 726-33 (3rd ed. 1979), the teachings of which are incorporated by reference. Liquid crystal displays are commonly used in calculators and digital watches, and thin screen television displays are being introduced.

SUMMARY OF THE INVENTION

Use of the twisted-nematic field effect in oscilloscope displays has the advantages of very low power consumption and voltage threshold, improved lifetime, a wide viewing angle in the reflecting mode, and is not subject to image washout at high ambient light levels. Information is displayed by analog addressing techniques that render null points along an x-y grid.

Despite the numerous advantages of utilizing liquid crystal displays, they have been heretofore unable to provide a practical alternative to cathode-ray oscilloscopes because of the inability to achieve speeds of response matching those of commercially available oscilloscopes. This problem is alleviated by the use of analog multiplexing techniques in order to scan the liquid crystal display. A grid is formed by two interleaved arrays of alternate parallel electrodes. An analog multiplexer is used to scan the display by addressing one line at a time along one of the arrays. The liquid crystal oscilloscope described herein is capable of displaying waveforms of electric signals with frequencies as high as 1 MHz.

Multiplexing of the large number of lines needed to provide meaningful visual information on a liquid crystal oscilloscope display has been thought to be unfeasible. According to R. Kirk & D. Othmer, supra, Vol. 7, at 733, "Liquid crystals have the threshold characteristic required for multiplexing, but the electrooptic response is angle dependent, temperature dependent and becomes saturated as the optical axis of the sample gets near the applied electrical field. These latter characteristics make multiplexing of LCDs difficult. Operation at ⅓ duty cycle (n=3) has currently been achieved in commercial calculators. It is not at all clear, however, whether 100 lines can ever be scanned successfully. High-information-content LCDs probably will require drive schemes that employ a memory device, e.g., a transistor circuit in series with each information position."

The liquid crystal oscilloscope described herein is capable of multiplexing, by way of example, sixty-four vertical lines with a clock operating at a frequency of 64 MHz without the problems described above. The number of multiplexed lines can be increased in order to provide better resolution and a larger display. Increasing the number of multiplexed lines results in longer times to complete the scan of all of the lines. Each line being addressed is isolated from the others and functions like a sample-and-hold circuit with the liquid crystal and interleaved electrodes acting as a capacitor and the high impedance switching device connected to the vertical lines, such as a multiplexer, constituting the resistive component. Since each channel is analog, a gray scale exists at the portions of a vertical strip immediately above and below the actual null points. The gray scale enables use of a minimum of multiplexer channels in order to achieve suitable resolution.

The display device of the invention can be made in a compact and light-weight form which is battery-powered. Accordingly, the display device is readily adaptable to serve as a portable oscilloscope, portable EKG device, or in applications where a compact oscilloscope is of advantage.

Further features of the invention include the use of a digital voltmeter, frequency counter, auto sync circuitry, dual trace, and display cursor in combination with the display device to expand the capabilities of the device.

Still other objects and advantages of the invention will be apparent from the specification and drawings.

BRIEF DESCRIPTION OF THE DRAWINGS

For a complete understanding of the invention, reference should be made to the following detailed description in connection with the accompanying drawings, in which:

FIG. 1 is a view of a device containing a liquid crystal oscilloscope display;

FIG. 2 is a view of a liquid crystal oscilloscope display with a vertical cursor;

FIG. 3 depicts the configuration of the resistor and conductive strips on the inner surfaces of the two plates;

FIG. 4 depicts the configuration of the resistor and its associated conductive strips on the inner surface of one of the plates;

FIG. 5 depicts the configuration of the multiplexed conductive strips on the inner surface of one of the plates.

FIG. 6 is a cross-sectional view looking vertically from the top or bottom of a liquid crystal oscilloscope display;

FIG. 7 is a cross-sectional view looking horizontally from the side of a liquid crystal oscilloscope display;

FIG. 8 is a view of the electrical connections between conductive strips and a printed circuit board;

FIG. 9 is a view of the electrical connections between conductive strips and a printed circuit board;

FIG. 10 is a view of the electrical connections between conductive strips and a printed circuit board;

FIG. 11 is a view of the electrical connections between conductive strips and a printed circuit board;

FIG. 12 is a block diagram of the major components of a device containing a liquid crystal oscilloscope display;

FIG. 14 is a logic diagram of the auto sync circuitry;

FIG. 15 is a diagram of an alternative embodiment utilizing a tunable inductor.

DESCRIPTION OF THE PREFERRED EMBODIMENTS

Figure 13:
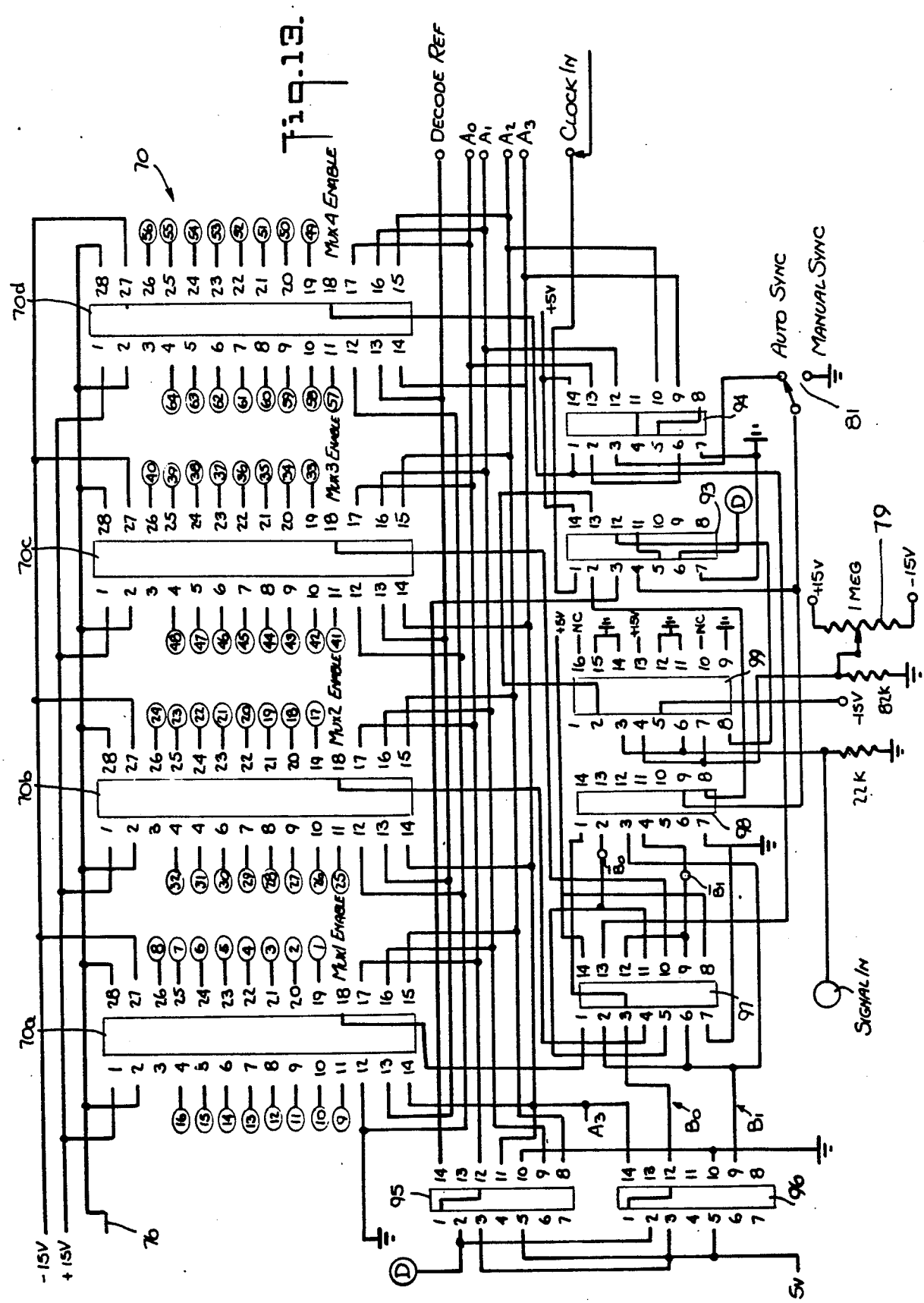
FIG. 13 is a schematic diagram of the electronic circuitry.

Referring now to FIGS. 1 and 6, there is depicted the preferred embodiment of the display device 10 in accordance with the invention. Display device 10 includes a liquid crystal display 11, or viewing screen, having a first transparent plate 12 which is maintained in closely spaced relation to a second transparent plate 14 by means of a peripheral sealing member 16. On the inner surface 12a of plate 12 there is disposed an array of closely spaced parallel vertical lines 20, or first conductive elements, of a substantially conductive material. The lines extend vertically when the front surface 10a of display device 10 is disposed in a vertical plane. The lines 20 can be formed by a use of a photo-resist material and an etching process. By way of example, each of lines 20 may have a width of approximately 0.007–0.010 mm. Further, by way of example, display device 10 may include sixty-four lines 20.

Each line 20 is provided with an electrical connection to one of a series of tracks 21 on a printed circuit board 22 (FIGS. 8-12). In turn each of tracks 21 connect to a separate output channel of an analog multiplexer 70 (FIG. 9), the function of which will be discussed more particularly below.

The connection between each of closely spaced parallel vertical lines 20 on surface 12a and the corresponding track 21 on printed circuit board 22 can be accomplished by means of a cylindrical connector element 23 of elastomeric material shown in FIGS. 8-11. The connector element 23 comprises a plurality of circular conductive rings 23a which are spaced apart from one another at an interval corresponding to that of the parallel lines 20 and to that of the series of tracks 21 on circuit board 22. The connector element 23 is pressed between circuit board 23 and the inner surface 12a of plate 12, thereby deforming the connector 23. As a result the circular conductive rings 23a are urged against lines 20 and tracks 21, thereby forming electrical connection between each line 20 and each track 21 of the array of tracks on circuit board 22. In turn, the tracks 21 are connected to the output channels of analog multiplexer 70.

One characteristic of each line 20 in FIG. 3 is that, since the line is substantially non-resistive, a voltage existing at the end of any line 20 which is electrically connected to multiplexer 70 is present along the entire length of line 20.

As shown in FIGS. 4 and 6, there is deposited on inner surface 14a (FIG. 6) of plate 14 an impedance element such as resistor 30, or means for applying a different predetermined voltage to each first conductive element, (FIG. 3) having end terminals 32 and 34. Resistor 30 defines a resistive electrical path of predetermined length and configuration between the terminals 32 and 34. Thus, for example, a positive voltage of +50 volts can be applied to terminal 32 through lead 36, or means for placing a voltage source in circuit with the first conductive element, while terminal 34 can be connected through lead 38 to a negative voltage of −50 volts. Resistor 30 defines a series of closely spaced parallel lines 40, or second conductive elements, joined at respective ends by relatively short resistive cross strips 42, or resistive elements of substantially the same resistance, to define a single resistor 30 extending between terminals 32 and 34. Resistor 30 is conditioned to be substantially electrically linear along its length.

As shown in FIG. 3, lines 20 and lines 40 extend perpendicular to one another and are located on spaced-apart parallel planes defined by the inner surface 12a of plate 12 and inner surface 14a of plate 14. It is preferable for the intervals between parallel lines to be as narrow as possible. The substantially non-resistive lines 40 and resistor 30 may be formed by the electrodeposition of a layer of tin oxide on a glass plate. The tin oxide has the property of being essentially transparent, of being substantially non-resistive when deposited in thin strips or lines, and of having linear resistance when deposited in somewhat thinner strips or lines. The preferred material for deposition of substantially non-resistive vertical lines 20 on the inner surface 12a is indium-tin oxide. Although the number of vertical lines 20 and horizontal lines 40 shown in FIG. 3 can be varied, the resulting grid should enable there to be convenient viewing of the display 11 of device 10 as shown in FIG. 1. By way of example, a suitable display 11 for showing waveforms of electrical singals can consist of two hundred horizontal lines 40 and sixty-four vertical lines 20.

As shown in FIGS. 6 and 7, there is disposed between plates 12 and 14 and sealing member 16 a thin layer of nematic liquid crystal material 44. While nematic liquid crystal material is illustrated in the embodiment of FIGS. 6 and 7, any field effect light scattering or light emitting dielectric may be utilized. In the embodiment shown in FIGS. 6 and 7, plates 12 and 14, vertical lines 20, and horizontal lines 40 are transparent. As will be described more particularly below, liquid crystal material 44 is likewise transparent in the absence of the application of an electric field thereto, so that where no potential difference exists between an overlapping line 20 and line 40, light may be freely transmitted through display 11. Device 10 may also operate on a reflection principle. In such a case, only plate 12 and lines 20, or plate 14 and lines 40 need be transparent.

Control of electric fields applied to selected regions of liquid crystal material 44 permits the production of a number of optical effects. If a light generator is placed on one side of device 10 in FIG. 7, for example facing plate 12, and the device is viewed from the side of plate 14, light emission can be controlled using transmissive liquid crystals as a "shutter". If light absorbing material is placed on either side of plate 12, and the device 10 is viewed from plate 14, then light absorption can be controlled using trans flective liquid crystal, which either transmits or reflects light. One characteristic of the device 10 is that it is not limited to operate with light applied from an artificial light source. Thus the device can also operate simply with ambient light. In the preferred embodiment, a light reflecting material 46 is placed adjacent the outer side 14b of plate 14 and the device is viewed from the side of plate 12, such that light reflection by reflecting material 46 is controlled by transmissive liquid crystal. Another embodiment would involve viewing device 10 from the same side as the artificial or ambient light source, in which light reflection back to the viewer is controlled using reflective liquid crystal, which either reflects or absorbs light.

Scanning of the entire rectangular area defined by lines 20 and lines 40 is accomplished by utilizing an analog multiplexer 70, or means for sequentially switching the input voltage to each second conductive element. In the preferred embodiment four 16-channel analog multiplexer integrated circuits 70a, 70b, 70c and 70d are used, such as a HI-516 multiplexer circuit manufactured by the Harris Corporation. Referring to FIG. 13, the four multiplexer circuits 70a–d form a sixty-four output channel multiplexer 70. Probes 13 (FIGS. 1 and 12) are used to pick up an input signal which is to be displayed on screen 11 of device 10. The input signal is fed by probes 13 into the input port of a signal amplifier unit 72 (FIG. 12). The signal amplifier unit 72 is used to amplify or attenuate the input signal to provide meaningful displays of waveforms of different amplitude. A manual gain control 73 can be used to adjust the gain of amplifier unit 72 and thereby the amplitude of the input signal. Signal amplifier unit 72 contains a programmable gain amplifier 72a and an auto-range circuit 72b which is adapted to adjust the amplitude of the input signal as a function of the potential difference which is maintained between end terminals 32 and 34 of resistor 30 (FIG. 3) and the output voltage range of the multiplexers 70a–d.

After passing through signal amplifier 72 (FIG. 12), the input signal is routed through several separate functional blocks. A digital voltmeter 74 with automatic range capability which is known in the art is used to provide a visual display of the digital value of the input voltage on display 11. A frequency counter 75 with automatic range capability determines the frequency of the input signal which is applied to device 10. The input signal is also fed into autosync circuitry 91, the function of which is described below in connection with FIG. 14.

The input signal is also fed into analog multiplexer 70 by feeding the input signal into line 76 which is connected to pins 2 and 28 of each of the four multiplexer circuits 70a–d (FIG. 13). An analog output signal is sequentially gated from each of the output terminals of each of multiplexer circuits 70a–d. Pins 19-26 and 4-11 on each of the multiplexer circuits 70a–d comprise the sixteen analog output terminals. The total of sixty-four analog output terminals for the four multiplexer circuits 70a–d are each connected to different conductive lines 20 on the inner surface 12a of plate 12. The connection between each of the sixty-four separate conductive lines 20 and each of the sixty-four tracks 21, or means for sequentially coupling an input voltage which is a predetermined function of the input signal at particular sample times to each second conductive element, on printed circuit board 22 (FIG. 10), which lead to the sixty-four analog output channels, is provided by means of the elastomeric connector element 23 which has been described above.

The multiplexer control circuitry 92 (FIG. 12), or means for repetitively scanning the input voltage, is used to determine which one of the sixty-four analog output terminals will pass the input signal. Square wave generator 76 which includes crystal oscillator 76a and auto-time base oscillator 76b produces clock pulses for the multiplexer control circuitry 92. The clock pulses are inputted by line 86 to multiplexer control circuitry 92. The clock pulses are delivered to pin 1 of a quadruple 2-input positive AND gate, for example a SN7408 integrated circuit, which is shown as first integrated AND circuit 93 in FIG. 13. The input to pin 2 of AND circuit 93 is high, except when the auto sync circuitry 91 is holding up the scan at pin 2 by means of line 91a, with the result that the output of the AND gate at pin 3 of first AND circuit 93 normally matches the clock input at pin 1.

The clock frequency controls the sweep frequency of the oscilloscope of the invention. This clock signal is inputted into pin 14 of first counter circuit 95, for example a SN7493 integrated circuit, which is a 4-bit binary counter. The binary counter outputs the binary signals $A_3$, $A_2$, $A_1$, $A_0$, corresponding to the number of clock pulses counted, with $A_3$, $A_2$, $A_1$, and $A_0$ corresponding to the outputs on pins 11, 8, 9 and 12, respectively, of counter 95. The signals $A_3$, $A_2$, $A_1$, $A_0$ are inputted into each of the multiplexer circuits 70a–d to select one of the sixteen available channels as the output. Since all four multiplexer circuits 70a–d are simultaneously fed signals $A_3$, $A_2$, $A_1$, $A_0$, four possible output channels exist. Pin 18 on each of the multiplexer circuits 70a–d is the enable input; however only one of multiplexer circuits 70a–d is enabled at any one time. Accordingly, only one output channel is being used at a time out of the total of sixty-four.

The circuitry shown in FIG. 13, including second counter circuit 96 (for example a SN7493 integrated circuit), a quadruple 2 input positive NOR gate (for example a SN7402 integrated circuit) which is NOR circuit 97, and a hex inverter circuit 98 (for example a SN7404 integrated circuit) allow only one of multiplexers 70a–d to be enabled at a time.

Second counter circuit 96 acts as a two bit binary counter, using signal $A_3$ as the input at pin 14. Every sixteen clock pulses into first counter circuit 95 causes $A_3$ to go high and then low, thereby increasing the count being kept by second counter circuit 96 output signals $B_1$ (pin 9) and $B_0$ (pin 12) by one. Signals $B_1$ and $B_0$, and the complements routed through hex inverter circuit 98, are used as inputs for four gates on NOR circuit 97. As $B_1$ and/or $B_0$ change after sixteen clock pulses, only one of the four NOR gates will have a high output, and since each NOR gate output is connected to the ENABLE pin 18 of a different one of the multiplexer circuits 70a–d, only one multiplexer circuit will be enabled at any time.

The output signals on pins 1, 4, 10 and 13 of NOR circuit 97 are designated as MUX 1 ENABLE, MUX 2 ENABLE, MUX 3 ENABLE, and MUX 4 ENABLE, respectively. As a result, each of the sixty-four lines 20 of the display 20 is sequentially scanned as clock pulses are sent to the multiplexer control circuitry 92 (FIG. 12).

The principle of operation of display device 10 will be explained in connection with the representation of FIG. 3 with like reference numerals being applied to like elements. By way of example, it is assumed that a positive voltage of fifty volts is applied to end terminal 32 of resistor 30 through lead 36 and a negative voltage of fifty volts is applied to the end terminal 34 through lead 38. It is also assumed that leads 36 and 38 are substantially non-resistive, so that the entire 100 volt potential difference exists between end terminals 32 and 34. Further, it is assumed that resistor 30 is substantially electrically linear along its electrical path, so that voltages of 25, 0 and −25 volts are respectively present at locations such as those designated 46, 48 and 50 along the length of resistor 30.

Depending upon the magnitude of a input signal at probe 13, a voltage anywhere between −50 and 50 volts will be applied along a single scanned vertical line 20. It is assumed that each of scanned lines 20 is substantially non-resistive, so that the voltage applied through one of the output channels of multiplexer 70 connected to lines 20 appears uniformly along the length of a given scanned line 20.

For example, if analog multiplexer 70 outputs a voltage of plus fifty volts to a scanned line 20, then the region of liquid crystal material 44 where the particular line 40 connected to resistor 30 near end terminal 32 overlaps the scanned line 20 would have no electric field applied thereto. The reason is that plus fifty volts is applied to end terminal 32. On the other hand, for the line 40 extending horizontally from location 50, the voltage difference across the liquid crystal material would be 75 volts where it overlaps the scanned line 20. For line 40 connected to resistor 30 adjacent end terminal 34, the voltage difference across the liquid crystal would be the full 100 volts. Thus, the portions of liquid crystal material 44 adjacent to scanned line 20, except for the region also adjacent to line 40 extending from end terminal 32, would be subjected to an electric field.

While the strength of the electric field required to activate a particular liquid crystal material varies from material to material, it can be assumed that all of the liquid crystal material 44 adjacent lines 40 connected to resistor 30 except for that line 40 extending horizontally from the region of end terminal 32 would be rendered opaque.

As the voltage through analog multiplexer 70 varies as each vertical line 20 is sequentially scanned, the zero potential difference point shifts vertically with respect to display 11. Thus, if the voltage applied to the next vertical line 20 equals 0 volts, the zero potential difference point is in the region along scanned line 20 adjacent to the horizontal line 40 that extends from location 48 on resistor 30. Under these conditions, a voltage difference of 25 volts would exist at points overlapping horizontal lines 40 extending from both points 46 and 50. The 50 volt potential difference in the region of overlap with horizontal lines 40 connected adjacent end terminals 32 and 34 would place the liquid crystal material 44 in those regions in an opaque state.

The foregoing principle is further illustrated in connection with FIG. 7, wherein arrows 52 illustrate ambient light applied to display device 10, while arrows 54 represent the light reflected back through the device. The region 56 of liquid crystal material 44 is transparent and represents the region at which the potential on overlapping horizontal lines 40 equals the potential on vertical line 20. Regions 58 on either side of region 56 represent the transition between transparency and opacity, a gray scale above and below the zero potential point, and represent the region of liquid crystal material 44 where the electric field is sufficient to cause some disruption, but insufficient to render the liquid crystal material opaque. If the zero potential spot was being displaced by the variation of the voltage at probe 13, then regions 58 might also represent areas wherein the disturbed liquid crystal material was relaxing into the transparent state, or wherein disruption was in the process of causing opacity. The regions 60 on either side of regions 58 represent areas wherein the potential difference between horizontal strips 40 and vertical strip 20 is sufficient to cause the liquid crystal material therebetween to be substantially opaque.

In accordance with the invention, each vertical line 20 is isolated from all other vertical lines 20, thereby effecting a built-in sample-and-hold circuit with the liquid crystal display being the capacitive component and the high impedance multiplexer 70, or means for sequentially enabling each different sample-and-hold circuit, being the resistive component. It is important to note that the analog multiplexer output signal level will change immediately with a new input signal level or on the next multiplexer scan. The individual vertical lines 20 can be kept isolated from the other vertical lines 20 as each one individually renders a null point somewhere along its length since an analog address technique utilizing multiplexing has been applied in scanning each channel. Since each channel is analog and contains a gray scale above and below the null point representing the transition area 58 between transparency and opacity, a minimum of multiplexer channels can be used to render a high resolution wave shape. The gray scale creates an apparent high resolution.

There are a number of factors which influence degradation of LCD displays. One that appears to be pertinent is the presence or absence of d.c. voltages which the LCD display might see in all modes of operation. The use of analog multiplexing to address each vertical line 20 interrupts the d.c. level present on that multiplexer output line, yielding a resultant pulse. The pulse is repeated once each of the sixty-four (number of addresses of multiplexer 70) switch lines out of the total scan. The nature of the liquid crystal display as a capacitor with a very high parallel resistance causes pulses on a single vertical line 20 to have equal energy on the positive and negative side of zero. The capacitor thereby a.c. couples the pulses to the display in such a way that there is no net d.c. component across the LCD display.

In the present invention, the liquid crystal material 44 between plates 12 and 14 acts as a capacitor. The analog multiplexer 70 functions as a high impedance switch. Therefore, there is good persistence in the displayed waveforms since the capacitive and resistive effects prevent rapid discharge of the voltage level on any of the vertical lines 20.

In an alternative embodiment, improved persistence can be obtained at low frequencies by actuating low frequency switch 77 in FIG. 5, thereby adding capacitors 78 across each analog output channel. The additional capacitance increases the time constant of the circuit and thereby the time during which each vertical line 20 can maintain a charge.

An auto sync circuit 91, or means for synchronizing the scanning of the input signal, is shown in FIGS. 13 and 14. The auto sync circuit is based on the function of holding the sixty-four channel scan before the first channel is scanned until the proper analog input signal level is present. The major component is the first counter circuit 95 which counts from 0 to 15 in binary code when presented with a clock pulse at pin 14, as long as either pin 2 or 3 or both are low. For every clock pulse entering at pin 14, a binary count of 0 to 15 will be outputted as $A_3$, $A_2$, $A_1$ and $A_0$. The counter starts at 0000, and with every pulse, advances forward one number. When $A_0$, $A_1$, $A_2$ and $A_3$ are all high, the number is 15. When the first counter circuit 95 reaches 15 and another pulse is introduced at pin 14, the counter resets to 0 ($A_0$, $A_1$, $A_2$ and $A_3$ go low) and starts to count up again. If both pins 2 and 3 go high at any time during the count, the counter outputs will be reset to 0 ($A_0$, $A_1$, $A_2$ and $A_3$ go low) and the counter will not count, even if pulses continue entering at pin 14. The counter will only resume counting when either pin 2 or 3 go low.

In the sync circuit shown, pin 3 is permanently high, so that pin 2 acts as the control pin. If pin 2 goes high, the first counter circuit 95 will return to 0000 regardless of what number it has previously counted to. When pin 2 goes low, the counter starts counting from 0 to 15 and back again until pin 2 again goes high. The binary output of the first counter circuit 95 is also used as the input for the four multiplexer circuits 70a–d that are connected to the vertical lines 20.

In order to achieve an auto sync, it is necessary that the incoming signal be sampled at the same portion of the waveform for every sixty-four channel scan. In order to accomplish this, the auto sync circuit determines when multiplexer 70 is on either channel 1 or 64, and when the incoming signal matches a preset level. In the auto sync circuit, the last channel, channel 64, will be the sync time and a precision quad comparator circuit 99, for example a HA-4905 integrated circuit, will seek the sync level. The comparator circuit 99 and the circuitry associated therewith act as an absolute level comparator which causes signal A to go high when the incoming signal level matches the level manually set with a tunable 1 megohm potentiometer 79.

The AND gates on the second AND integrated circuit 94, or means for delaying the scanning of the second conductive elements, are used to indicate when the scan has reached channel 64. When A0, A1, A2 and A3 and the MULTIPLEXER 4 ENABLE signal are high, the last channel on the last multiplexer circuit 70d is being scanned, and signal B, the output signal from the AND gate circuitry, goes high.

When auto sync switch 81 is in the manual mode, the first counter circuit 95 will never be reset since the input into pin 2 will always be low. The scan will not be held and the displayed wave forms will drift horizontally back and forth. When operating in the auto sync mode, the AND gate in first AND circuit 93 through which clock pulses pass to the input of first counter circuit 95 will be disabled when channel 64 is scanned. Signal C cannot go high, so that the scan is held because first counter circuit 95 is unable to receive any clock pulses. When the input signal level matches the preset value, signal A goes high, enabling an AND gate in conjunction with high signal B. This causes signal D to go high, which is input into pin 2 of both counter circuits 95 and 96. Signal D forces circuit 95 to reset $A_3$, $A_2$, $A_1$ and $A_0$ to 0000, and forces circuit 96 to reset $B_1$ and $B_0$ so that the MUX 4 ENABLE signal goes to 0. The resetting of $A_3, A_2, A_1, A_0$ forces signal B to go low, thereby enabling the AND gate which allows clock pulses to pass to pin 14 of first counter circuit 95. The reset of circuit 95 also forces signal D to go low, thereby removing the reset signal from pin 2 of both counter circuit 95 and 96. This allows the counters to count to sixty-four again so that the vertical lines 20 can be sequentially scanned.

Another feature of the invention is a vertical cursor 10 that can be moved horizontally across the display 11 on display device 10, as shown in FIG. 2. Device 10 has a keypad 83 (FIG. 12) with keys which can be used to manually enter instructions into processor 85. Certain keys, or means for preselecting one second conductive element, are pressed to turn the cursor feature on and off and to move the cursor left or right. The processor 85, or means for providing a cursor in a predetermined location, stores a number representing which one of the sixty-four channels, corresponding to each of the vertical lines 20, the operator has chosen as the cursor channel. The processor is able to determine which output channel is being scanned at any time by retrieving the values of $A_3, A_2, A_1$ and $A_0$ from the first counter circuit 95, and by retrieving the values of $B_1$ and $B_0$ from pins 9 and 12, respectively, of second counter circuit 96. Whenever the six counter output signals indicate that the vertical line 20 being scanned matches the particular cursor channel entered by the operator, the processor 85 will prevent the display from operating by disabling cursor switch 86, or means for interrupting the scanning of the input voltage to the preselected element, which is connected between signal amplifier 72 and the inputs into analog multiplexer 70. The disabling of cursor switch 86 will result in the display 11 being dark along the vertical path of scanned line 20 at the location where a portion of the waveform would otherwise have been displayed. Instead, the voltage on the preselected second conductive element 20 will rapidly decay to zero, so that a spot indicating the zero potential difference point is in the region along preselected element 20 adjacent to the horizontal line 40 that extends from location 48 on resistor 30. (FIG. 3).

The display 11 can alternatively be made dark along the entire vertical path of preselected element 20 by having cursor switch 86, or means for placing a fixed voltage on the preselected element, connected to a second input from a fixed voltage source that exceeds +50 or −50 volts. The processor 85 causes the cursor switch 86 to switch to the second input when the cursor channel is being scanned. This places a voltage unequal to any of the voltages on the horizontal lines 40 connected to resistor 30 onto the preselected element 20. The difference in voltages between the preselected element 20 and all of the horizontal lines 40 causes the display to be black along the entire vertical path of the preselected element 20, thereby displaying a black vertical cursor line that moves when a different cursor channel is selected.

In addition, the processor 85 will send a pulse to digital voltmeter 74, or means for sampling the voltage level at the time of scanning the preselected element, when the cursor channel is being scanned. This pulse will cause the digital voltmeter to sample-and-hold the instantaneous voltage of the input signal as the cursor channel is scanned. In this way, the voltage level of the waveform where it would have otherwise intersected the vertical line 20 on the display can be displayed in digital form on device 10, or means for indicating the voltage level of the input signal.

Another embodiment of the cursor feature shown in FIG. 2 requires the placing of fixed indicia 100 on plate 12 or plate 14, preferably the plate closest to the viewer. The fixed indicia 100 can be etched, painted, or adhered to the plate and principally consists of an easily visible vertical line that exactly overlays one of the vertical lines 20. For viewing convenience, it is preferable to overlay a vertical line 20 near the center of the display, e.g., no. 33, and have it serve as the preselected element. In this embodiment, the fixed indicia 100 functions as the cursor line and there is no need to use a cursor switch 86. Different portions of the waveform can be intersected by the cursor line by manually adjusting the tunable 1 megohm potentiometer 70. (FIG. 14). The scanning of the input signal is delayed by the auto sync circuit 91 until the incoming signal matches the preset level, so that the waveform can be horizontally shifted on the display as tunable potentiometer 79 is adjusted. When the cursor feature is selected, the instantaneous voltage of the input signal where it intersects the vertical cursor line (FIG. 2) is displayed by digital voltmeter 74 as described above, with the processor 85 sending a pulse at the time of scanning of the particular preselected element 20 that is overlayed by the fixed indicia 100.

In the present invention, a voltage is placed across resistor 30 in FIGS. 3 and 12 by means, for example, of a ±50 volt power supply 87. By means of vertical position control 88, the operator can manually adjust the voltages applied across resistor 30 at end terminals 32 and 34 and thereby vertically adjust the zero voltage position on the display 11 on device 10. The display 11 is also able to trace two separate waveforms obtained from input signals connected to two different probes 13, or means for receiving the electrical input signal and a second electrical input signal. A dual trace switch 89, or means for sequentially and alternatly introducing one of the input signals to the sequentially coupling means, is connected to both probes 13 and has a single output to signal amplifier 72. When the operator uses the keypad 83 to manually indicate that a dual trace is desired, the processor 85 will look at signal $A_0$ from first counter circuit chip 95 which switches high or low with every clock pulse. As signal $A_0$ changes, processor 85 will send a signal to dual trace switch 89 which causes it to switch back and forth between the two input probes 13. As a result, the odd-numbered vertical lines 20 will display a waveform different from that of the even-numbered vertical lines 20 when scanned. Signal amplifier 72 contains a programmable gain amplifier, or means for adjusting the input voltages applied by the introducing means, which will look at signal $A_0$ when in the dual trace mode and separate the horizontal center lines on the display 11 for the two waveforms. Thus, the first input signal may be processed so as to use the horizontal line 40 extending from location 50 (FIG. 3) along resistor 30 as its horizontal center line, whereas the second input signal may instead use the horizontal line 40 extending from location 46 as its horizontal center line. In this manner, a display with a dual trace is obtained.

An alternative embodiment of the invention utilizes an inductor 98 in place of analog multiplexer 70 as shown in FIG. 15. The input signal is routed into the inductor 101 by an output line from signal amplifier 72 which is connected to one end of the inductor. The inductor 101 has sixty-four taps 102 which are each connected to different conductive lines 20 on the inner surface 12a of plate 12. At high frequencies the inductor 101 acts like a delay line, so that the voltage level at each of the taps 102 is equivalent to the voltage level of the input signal at different sample times. The liquid crystal display acts as a series of capacitive components that allow circuits involving each of the taps 102 to be completed. In order to obtain a meaningful display, the inductor 101 must be tunable. Whenever the input signal is periodic, a standing waveform is obtained along the length of inductor 101 by tuning the inductor 101 so that the frequency of the input signal is an integer multiple of the resonant frequency associated with the tuned inductor. The response time and other characteristics of the liquid crystal material 44 between the vertical lines 20 connected to each tap 102 and the inner surface 14a on the opposite plate 14 are such that the effective potential difference across each vertical section of the liquid crystal 44 will be proportional to the rms voltage present at each tap 102 along inductor 101. In this way, the null points rendered along the lengths of adjacent vertical lines 20 will represent the input signal voltage levels at a series of discrete consecutive times, and will remain stable if the inductor 101 is properly tuned and the frequency of the input signal does not vary.

The variable optical properties of the materials available for use in the viewing screen enable light transmission to be controlled in several different modes. As used throughout the above specification, the term "transmission" embodies each of the following methods of displaying waveforms: (1) a transmissive liquid crystal material, which is either transparent or opaque, is used and either (a) the viewer and light source (artificial or ambient) are on opposite sides of the viewing screen, or (b) the viewer and light source are on the same side of the viewing screen, with one of the surfaces on the plate farthest from the viewer being reflective; (2) a reflective liquid crystal material, which is either reflective or light absorbing, is used and the viewer and light source are on the same side of the viewing screen; (3) a transflective liquid crystal material, which is either transparent or reflective, is used and either (a) the viewer and light source are on opposite sides of the screen, or (b) the viewer and light source are on the same side of the viewing screen, with one of the surfaces on the plate farthest from the viewer being light absorbing; and (4) a light emitting material, which is either luminescent or dark, is used and the viewer is on one side of the viewing screen, with no light source required. Depending upon the particular liquid crystal material chosen, the presence of an electric field can cause the material to exhibit either one of the two optical properties possible for that type (e.g., transmissive, reflective, transflective) of liquid crystal material. Thus it is possible to have either a light representation of the input waveform surrounded by a dark field, or a dark representation of the input waveform surrounded by a light field.

Although the present invention is described utilizing liquid crystal displays, similar techniques can be applied using optoceramic or electroluminescent displays; however, the voltages required for these embodiments would be higher.

What is claimed is:

1. Apparatus for providing a visual display of an electrical input signal, comprising:
   a viewing screen of predetermined thickness having two oppositely disposed parallel faces and formed of a material having optical properties which in any predetermined portion of the screen are variable in response to the application of a predetermined electrical potential across the thickness of the screen in the predetermined portion, the variable optical properties enabling the transmission of light to be controlled with respect to the predetermined portion,
   a plurality of first conductive elements disposed spaced apart with respect to one another, the plurality of first conductive elements being positioned adjacent and substantially parallel to one face of the screen,
   means for applying a voltage gradient across said plurality of first conductive elements to produce a different predetermined voltage on each of the plurality of the first conductive elements and wherein the relationship of each predetermined voltage with respect to another is predetermined,
   a plurality of second conductive elements disposed spaced apart with respect to one another, the plurality of second conductive elements being positioned adjacent and substantially parallel to the other face of the screen and extending at an angle to the plurality of first conductive elements, means for sampling said electrical input signal at predetermined sample times and for producing respective input voltages, each of which being a predetermined function thereof and independent of any other input voltage, and
   means responsive to said sampling means for sequentially coupling to each of the plurality of second conductive elements said respective input voltages, whereupon each input voltage which is coupled to a respective one of the plurality of second conductive elements coacts with the different predetermined voltage of each of the plurality of first conductive elements across the thickness of the screen to form a plurality of different control voltages impressed across the screen, each of said control voltages enabling the optical properties of the predetermined portion of the screen across which the control voltage is applied to control the transmission of light with respect to the predetermined portion when said control voltage corresponds to a predetermined electrical potential.

2. Apparatus in accordance with claim 1 in which the screen is formed of a liquid crystal material.

3. Apparatus in accordance with claim 1 in which each of the plurality of the first conductive elements and the plurality of second conductive elements are linear in form.

4. Apparatus in accordance with claim 1 in which the first conductive elements are parallel to each other and the second conductive elements are parallel to each other.

5. Apparatus in accordance with claim 1 in which the plurality of the first conductive elements extend substantially perpendicular to the plurality of second conductive elements.

6. Apparatus in accordance with claim 1 in which the first conductive elements and the second conductive elements are substantially non-resistive, thereby enabling substantially the same voltage to be present at all points along the length of a given element.

7. Apparatus in accordance with claim 2 in which the liquid crystal material between corresponding predetermined portions on the opposite faces of the screen becomes opaque when a control voltage corresponding to the predetermined electrical potential is present between the corresponding predetermined portions on the faces.

8. Apparatus in accordance with claim 2 in which the liquid crystal material between corresponding predetermined portions on the opposite faces of the screen becomes transparent when a control voltage corresponding to the predetermined electrical potential is present between the corresponding predetermined portions on the faces.

9. Apparatus in accordance with claim 1 in which the means for applying a different predetermined voltage to each of the plurality of the first conductive elements further comprises means for electrically connecting each first conductive element to the first conductive elements adjacent thereto to enable a potential difference to exist between adjacent first conductive elements and means for placing a voltage source in the circuit with the first conductive element electrically connected by the connecting means.

10. Apparatus in accordance with claim 9 in which the means for electrically connecting each first conductive element to the first conductive elements adjacent thereto comprises resistive elements of substantially the same resistance to create said voltage gradient, with the voltage difference between any immediately adjacent first conductive elements being substantially equal.

11. Apparatus in accordance with claim 9 in which the means for placing a voltage source in circuit with the first conductive element connected by the connecting means is in circuit with each of the first conductive element disposed adjacent the opposite ends of the plurality of first conductive elements.

12. Apparatus in accordance with claim 1 in which the means for sequentially coupling an input voltage to each of the second conductive elements further comprises means for sequentially switching the input voltage to each of the second conductive elements in order that the input voltage which is a predetermined function of the electrical input signal at the time of switching is sequentially applied to each of the second conductive elements, whereby the input voltage subsequently being switched to an adjacent second conductive element in order that the switching proceeds in the same direction with respect to the plurality of second conductive elements.

13. Apparatus in accordance with claim 12 in which the means for sequentially coupling to each of the plurality of second conductive elements an input voltage which is a predetermined function of the electrical input signal further comprises means for repetitively scanning the input voltage with respect to the plurality of second conductive elements.

14. Apparatus in accordance with claim 13 in which the scanning means is an analog demultiplexer connected to each of the plurality of second conductive elements.

15. Apparatus in accordance with claim 1 in which the electric input signal is one of analog input signals and digital input signals.

16. Apparatus in accordance with claim 1 for providing a visual display of a plurality of electrical input signals and further comprising an additional plurality of second conductive elements disposed spaced apart and parallel to one another, the additional plurality of second conductive elements being positioned adjacent to the other face of the screen and extending at an angle to the plurality of first conductive elements, and additional means for applying sequentially to each of the additional plurality of second conductive elements another input voltage which is a predetermined function of the other electrical input signals at particular sample times, each other input voltage when applied to one of the additional plurality of second conductive elements coacting with the predetermined different voltage of each of the plurality of first conductive elements across the thickness of the screen to form a plurality of additional different control voltages impressed across the screen, an additional control voltage when corresponding to the predetermined voltage condition enabling the optical properties of the predetermined portion of the screen to which the additional control voltage is applied to control the transmission of light with respect to the predetermined portion.

17. Apparatus in accordance with claim 13 in which the plurality of first conductive elements, the viewing screen, and the plurality of second conductive elements provide a capacitive component to the sequentially coupling means to enable the input voltage coupled to a given second conductive element during a given scan to persist at least in part until the next scan of the given second conductive element, thereby enhancing the persistence of the changing of the optical properties of the predetermined portion of the screen.

18. Apparatus in accordance with claim 17 in which the means for sequentially coupling to each of the plurality of second conductive elements an input voltage which is a predetermined function of the electrical input signal at particular sample times provides a resistive component which in conjunction with the capacitive component provided to the sequentially coupling means produces a resistive-capacitive time constant which enables the input signal voltage coupled to a given second conductive element during a given scan to persist.

19. Apparatus in accordance with claim 12 and further comprising a capacitance connected to each of the plurality of second conductive elements, each capacitance enabling the input voltage coupled to a given second conductive element by the sequential coupling means during a given scan to persist at least in part until the next scan of the given second conductive element, thereby enhancing persistence of a change of optical properties of the predetermined portion of the screen.

20. Apparatus in accordance with claim 1 further comprising:
means for receiving the electrical input signal and a second electrical input signal;
means connected to the receiving means for sequentially and alternately introducing one of the input signal and the second input signal to the means for sequentially coupling to each of the plurality of second conductive elements an input voltage which is a predetermined function of the electrical input signal and the second electrical input signal at particular sample times, whereby the optical properties of the predetermined portion of the viewing screen enable the transmission of light to be controlled in response to both the input signal and the second input signal.

21. Apparatus in accordance with claim 20, further comprising:
means for adjusting the input voltage applied to the second conductive elements by the introducing means so that the adjusted voltage sequentially coupled to the second conductive elements is different for the input signal and the second input signal in order that the visual display associated with the input signal and the second input signal are distinguishable even when the input signal and the second input signal are substantially identical.

22. Apparatus in accordance with claim 21 in which a first fixed voltage is added by the adjusting means to the input voltages applied to the second conductive elements when the input signal is introduced, and in which a second and different fixed voltage is added by the adjusting means to the input voltage applied to the second conductive elements when the second input signal is introduced.

23. Apparatus in accordance with claim 1 in which the means for sequentially coupling to each of the plurality of second conductive elements an input voltage which is a predetermined function of the electrical input signal at particular sample times comprises a different sample and hold circuit connected to each of the plurality of second conductive elements and means for sequentially enabling each different sample and hold circuit to apply at a particular sample time the input voltage to one of the plurality of second conductive elements.

24. Apparatus in accordance with claim 13 and further comprising:
means for synchronizing the scanning of the input signal with respect to the second conductive elements to the frequency of the input signal in response to a preselected voltage level of the electrical input signal comprising means for delaying the scanning of the second conductive elements by the scanning means until the electrical input signal is at the preselected level, whereby the visual display of an electrical input signal which is periodic can be presented on the viewing screen as a substantially stationary waveform.

25. Apparatus in accordance with claim 24 and further comprising means for providing a cursor in a predetermined location with respect to the second conductive elements when the scanning means scans the input signal in synchronism therewith; including means for preselecting one of the plurality of second conductive elements, and means in response to the preselecting of a second conductive element for interrupting the scanning of the input voltage to the preselected second conductive element, whereby the visual display of the input signal is changed at a location corresponding to the preselected second conductive element.

26. Apparatus in accordance with claim 25 and further comprising means for sampling the voltage level of the electrical input signal at the time of scanning the preselected second conductive element; and
means connected to the sampling means for indicating the voltage level of the electrical input signal at the time of sampling.

27. Apparatus in accordance with claim 26 in which the means connected to the coupling means for indicating the voltage signal of the electrical input signal at the time of sampling comprises a digital voltage meter.

28. Apparatus in accordance with claim 25 in which the screen is formed of a material such that the material between corresponding locations on the opposite faces of the screen becomes opaque when a potential difference exists between the corresponding locations on the faces, and further comprising:
means for placing a fixed voltage on the preselected element with the fixed voltage being unequal to any of the different predetermined voltages applied to the first conductive elements in order that light is not transmitted through the screen along a cursor line which is adjacent and parallel to the preselected second conductive element.

29. Apparatus as claimed with claim 24 and further comprising:
fixed indicia for the viewing screen, the fixed indicia extending substantially parallel and adjacent to a preselected second conductive element for providing a fixed visible cursor,
means for sampling the voltage level of the electrical input signal at the time of scanning the preselected second conductive element, and
means connected to the sampling means for indicating the voltage level of the electrical input signal at the time of sampling.

30. Apparatus in accordance with claim 1 in which the means for sequentially coupling an input voltage to each of the plurality of second conductive elements further comprises:
means connected to each of the second conductive elements and substantially resonant to the frequency of the input signal for presenting a different portion of a substantially stationary version of the waveform of the input signal to each different second conductive element, whereby a stationary waveform of the input signal can be displayed.

31. Apparatus in accordance with claim 30 in which the means connected to each of the second conductive elements and substantially resonant to the frequency of the input signal comprises:
an elongated conductive element having its inductance distributed throughout the length thereof, each of the different second conductive elements being connected to a different portion of the length of the inductive element in the order of the disposing of the plurality of second conductive elements with respect to the other face of the screen and in the order of the different portions of the inductive element along the length thereof, and
means for tuning the circuit formed by the inductive element when connected to the second conductive elements to be substantially resonant to the frequency of the input signal.

32. An oscilloscope for providing a visual display including a waveform or a bar chart of information contained in an input signal comprising:
a viewing screen of predetermined thickness and formed of liquid crystal material which is adapted to experience a change in optical properties in a portion of the screen which is subjected to a predetermined electrical state extending across the thickness of the screen,
a first substantially planar array of a plurality of first electrically conductive elongated elements extending spaced apart and parallel with respect to one another, the first array being disposed parallel and adjacent a surface of the screen,
means for establishing a predetermined voltage gradient across said first array, with each of the first conductive elements being at a different predetermined electrical potential with respect to the other first electrically conductive elements,
a second substantially planar array of a plurality of second electrically elongated conductive elements extending spaced apart and parallel with respect to one another, the second array being disposed substantially parallel and adjacent to the other surface of the screen, the plurality of second conductive elements in the second array extending at an angle to the plurality of first conductive elements in the first array, means for sampling said input signal at sample times and for producing respective input voltages, each of which being a predetermined function thereof and independent of any other input voltage, and means responsive to the sampling means for applying sequentially to each of the plurality of second conductive elements said respective input voltages, whereupon each input voltage which is coupled to a respective one of the plurality of second conductive elements coacts with the predetermined different voltage of each of the plurality of first conductive elements across the thickness of the screen to form a plurality of different control voltages impressed across the screen, each of said control voltages enabling the optical properties of the predetermined portion of the screen to which the control voltage is applied to control the transmission of light with respect to the predetermined portion when said control voltage corresonds to a predetermined electrical potential and thereby provide the visual display.

33. An oscilloscope in accordance with claim 32 in which the first conductive elements and the second conductive elements are substantially non-resistive, thereby enabling substantially the predetermined electrical condition and substantially the same input voltage respectively to be present at all points along the length of a given element and given second conductive element.

34. An oscilloscope in accordance with claim 32 in which the means for applying sequentially an input voltage to each of the plurality of second conductive elements further comprises means for sequentially switching the input voltage which is a predetermined function of the electrical input signal at the time of switching to each of the second conductive elements.

35. An oscilloscope in accordance with claim 34 in which the means for sequentially applying an input voltage to each of the plurality of second conductive elements further comprises means for repetitively scanning the input voltage with respect to the plurality of second conductive elements.

36. An oscilloscope in accordance with claim 35 and further comprising means for synchronizing the scanning of the input signal with respect to the second conductive elements to the frequency of the input signal in response to a preselected voltage level of the electrical input signal, the synchronizing means including means for delaying the scanning of the second conductive elements by the scanning means until the electrical input signal is at the preselected level, whereby the visual display of an electrical input signal which is periodic can be presented on the viewing screen as a substantially stationary waveform.

37. An oscilloscope in accordance with claim 36 and further comprising means for providing a cursor in a predetermined location with respect to the second conductive elements when the scanning means scans the input signal in synchronism therewith; the cennsor providing means including means for preselecting one of the plurality of second conductive elements and means in response to the preselecting of a second conducting element for interrupting the scanning of the input voltage to the preselected second conductive element, whereby the visual display of the input signal is changed at a location corresponding to the preselected second conductive element.

38. An oscilloscope in accordance with claim 37 and further comprising means for sampling the voltage level of the electrical input signal at the time of scanning the preselected second conductive element; and means connected to the sampling means for indicating the voltage level of the electrical input signal at the time of sampling.

39. An oscilloscope in accordance with claim 35 and further comprising:

a fixed indicia disposed adjacent of predetermined location or the face of the viewing screen;

means for selectively phasing the scan of the scanning means with respect to the input voltage to enable a selected portion of the visual display of the input signal to be positioned adjacent the fixed indicia;

means responsive to the phasing means for sensing the voltage level of the electrical input signal at the time voltage of scanning the input with respect to the second conductive element adjacent the predetermined location or the face of the viewing screen of the fixed indicia; and means connected to the sampling sensing means for measuring the voltage level of the electrical input signal sensed by the sensing means.

40. Method for providing a visual display of an electrical input signal or a viewing screen of predetermined thickness having two oppositely disposed parallel faces and formed of a material having optical properties which in any predetermined portion of the screen are variable in response to the application of a predetermined electrical potential across the thickness of the screen in the predetermined portion, the variable optical properties enabling the transmission of light to be controlled with respect to the predetermined portion, the viewing screen including a plurality of first conductive elements disposed spaced apart with respect to one another, the plurality of first conductive elements being positioned adjacent and substantially parallel to one face of the screen, the viewing screen further including a plurality of second conductive elements disposed spaced apart with respect to one another, the plurality of second conductive elements being positioned adjacent and substantially parallel to the other face of the screen and extending at an angle to the plurality of first conductive elements, the method comprising the steps of:

applying a voltage gradient across said plurality of first conductive elements to produce a different predetermined voltage on each of the plurality of the first conductive elements and wherein the relationship of each predetermined voltage with respect to another is predetermined, sampling said electrical input signal at predetermined times for producing respective input voltages, each of which being a predetermined function thereof and independent of any other input voltage, and responsive to said sampling sequentially coupling to each of the plurality of second conductive elements said respective input voltages, whereupon each input voltage which is coupled to a respective one of the plurality of second conductive elements coacts with the different predetermined voltage of each of the plurality of first conductive elements across the thickness of the screen to form a plurality of different control voltages impressed across the screen, each of said control voltages enabling the optical properties of the predetermined portion of the screen across which the control voltage is applied to control the transmission of light with respect to the predetermined portion when said control voltage corresponds to a predetermined electrical potential.

41. Method in accordance with claim 40 in which the viewing screen is formed of material which is a liquid crystal material.

42. Method in accordance with claim 40 in which each of the plurality of the first conductive elements and of the plurality of second conductive elements are linear in form.

43. Method in accordance with claim 40 in which each of the plurality of first conductive elements are parallel to each other and each of the plurality of second conductive elements are parallel to each other.

44. Method in accordance with claim 40 in which the plurality of the first conductive elements extend substantially perpendicular to the plurality of second conductive elements.

45. Method in accordance with claim 40 in which the different predetermined voltage applied to each of the first conductive elements is substantially uniform through the extent of the first conductive elements and the input voltage coupled to each of the plurality of second conductive elements is substantially uniform throughout the extent of the second conductive elements.

46. Method in accordance with claim 40 in which the step of applying a different predetermined voltage to each of the plurality of the first conductive elements further comprises the steps of electrically connecting each first conductive element to the first conductive elements adjacent thereto to enable a potential difference to exist between adjacent first conductive elements and placing a voltage source in the circuit with the first conductive element electrically connected by the connecting means.

47. Method in accordance with claim 46 in which the step of placing a voltage source in circuit with the first conductive element connected by the connecting means comprises placing the voltage source in circuit with each of the first conductive element disposed adjacent the opposite ends of the plurality of first conductive elements.

48. Method in accordance with claim 40 in which the steps of sequentially coupling an input voltage to each of the second conductive elements further comprises the step of sequentially switching the input voltage to each of the second conductive elements in order that the input voltage which is a predetermined function of the electrical input signal at the time of switching is sequentially applied to each of the second conductive elements, whereby the input voltage subsequently being switched to an adjacent second conductive element in order that the switching proceeds in the same direction with respect to the plurality of second conductive elements.

49. Method in accordance with claim 48 in which the step of sequentially coupling to each of the plurality of second conductive elements an input voltage which is a predetermined function of the electrical input signal further comprises the step of repetitively scanning the input voltage with respect to the plurality of second conductive elements.

50. Method in accordance with claim 40 in which the electrical input signal for which a visual display is to be provided is one of analog input signals and digital input signals.

51. Method in accordance with claim 49 and further comprising the step of utilizing the plurality of first conductive elements, the viewing screen, and the plurality of second conductive elements to provide a capacitive component during the sequentially coupling of the input voltge to each of the second conductive elements to enable the input voltage coupled to a given second conductive element during a given scan to persist at least in part until the next scan of the given second conductive element, whereby the persistence of the changing of the optical properties of the predetermined portion of the screen is enhanced.

52. Method in accordance with claim 51 in which the step of sequentially coupling to each of the plurality of second conductive elements or input voltage which is a predetermined function of the electrical input signal at particular sample times comprises the step of a resistive component which in conjunction with the capacitive component provided during the sequentially coupling results in a resistive-capacitive time constant which enables the input signal voltage coupled to a given second conductive element during a given scan to persist.

53. Method in accordance with claim 40 and further comprising the steps of
receiving the electrical input signal and second electrical input signal;
sequentially and alternately introducing one of the input signal and the second and input signal for sequential coupling to each of the plurality of second conductive elements an input voltage which is a predetermined function of the electrical input signal and the second electrical input signal at particular sample times, whereby the optical properties of the predetermined portion of the viewing screen enable the transmission of light to be controlled in response to both the input signal and the second input signal.

54. Method in accordance with claim 53 and further comprising the step of adjusting the input voltages applied to the second conductive elements by the sequential introducing of one of the input signal and the second input signal so that the adjusted voltage applied to the second conductive elements is different for the input signal and the second input signal in order that the visual display associated with the input signal and the second input signal are distinguishable even when the input signal and the second input signal are substantially identical.

55. Method in accordance with claim 49 and further comprising the step of synchronizing the scanning of the input signal with respect to the plurality of second conductive elements to the frequency of the input signal in response to a preselected voltage level of the electrical input signal comprises the step of delaying the scanning of the second conductive elements until the electrical input signal is at the preselected level, whereby the visual display of an electrical input signal which is periodic can be presented on the viewing screen as substantially stationary waveform.

56. Method in accordance with claim 55 and further comprising the step of:

providing a cursor at a predetermined location with respect to the second conductive elements while scanning the input signal in synchronism therewith; preselecting one of the plurality of second conductive elements; and interrupting the scanning of the input voltages to the preselected second conductive element in response to the preselecting of a second conductive element, whereby the visual display of the input signal is changed at a location corresponding to the preselected second conductive element.

57. Method in accordance with claim 56 and further comprising the steps of:
sampling the voltage level of the electrical input signal at the time of scanning the preselected second conductive element; and
indicating the voltage level of the electrical input signal at the time of sampling.

* * * * *